United States Patent [19]

Cogan

[11] Patent Number: 4,458,259

[45] Date of Patent: Jul. 3, 1984

[54] ETCHED-SOURCE STATIC INDUCTION TRANSISTOR

[75] Inventor: Adrian I. Cogan, Waltham, Mass.

[73] Assignee: GTE Laboratories Incorporated, Waltham, Mass.

[21] Appl. No.: 320,242

[22] Filed: Nov. 12, 1981

[51] Int. Cl.³ .................. H01L 29/80; H01L 29/06
[52] U.S. Cl. ........................................ 357/22; 357/55
[58] Field of Search .................................. 357/22, 55

[56] References Cited

U.S. PATENT DOCUMENTS

| | | | |
|---|---|---|---|
| 3,828,230 | 8/1974 | Nishizawa et al. | 357/22 |
| 4,288,800 | 9/1981 | Yoshida et al. | 357/22 |

FOREIGN PATENT DOCUMENTS

| | | | |
|---|---|---|---|
| 54-102877 | 8/1979 | Japan | 357/22 |
| 54-105978 | 8/1979 | Japan | 357/22 |

Primary Examiner—Martin H. Edlow
Assistant Examiner—John LaMont
Attorney, Agent, or Firm—J. Stephen Yeo; Theodore D. Lingren

[57] ABSTRACT

A gate-source structure and fabrication method for a static induction transistor. The method and the device are embodied by the epitaxial layer of, for example, high resistivity p-type semiconductor material grown on an epitaxial layer of high resistivity n-type semiconductor material. A silicon dioxide layer with source and gate windows is formed on the p-type epitaxial layer. Source grooves are formed in the p-type epitaxial layer at source window locations and the grooves are diffused with n-type impurities to form a diffusion region which extends to connect with the n-type epitaxial layer. Source and gate electrodes are formed in the source and gate windows.

1 Claim, 5 Drawing Figures

ETCHED-SOURCE STATIC INDUCTION TRANSISTOR

BACKGROUND OF THE INVENTION

This invention relates to gate-source structures for static induction transistors and, in particular, to an etched source structure requireing relatively simple fabrication techniques.

The static induction transistor is a field effect semiconductor device capable of operation at relatively high frequency and power. The transistors are characterized by a short, high resistivity semiconductor channel which may be controllably depleted of carriers. The current-voltage characteristics of the static induction transistor are generally similar to those of a vacuum tube triode. The devices are described by Nishizawa et al in U.S. Pat. No. 3,828,230 issued Aug. 6, 1974.

The static induction transistor generally uses vertical geometry with source and drain electrodes placed on opposite sides of a thin, high resistivity layer of one conductivity type. Gate regions of opposite conductivity type are positioned on opposite sides of the source. During operation a reverse bias is applied between the gate region and the high resistivity layer causing a depletion region to extend into the channel below the source. As the magnitude of the reverse bias is varied, the source-drain current and voltage derived from an attached energy source will also vary.

The design and fabrication of the gate-source structure is difficult. In order to operate at frequencies near or above 1 GHz, the structures must be built under extremely precise dimensional control. Involved dimensions are in the micrometer range, requiring photolithographic alignments with submicrometer precision.

Gate-source structures having a surface-gate geometry generally have relatively low voltage gain and relatively good high frequency performance capability. On the other hand, gate-source structures having a recessed or buried-gate geometry generally have relatively high voltage gain and relatively poor high frequency performance capability. The poor voltage gain of surface-gate structures may be attributed to the particular shape of the active channel, which is wider in the region near the drain than in the region near the source.

SUMMARY OF THE INVENTION

The present invention discloses a relatively simple manufacturing method for fabricating the gate-source structure of a static induction transistor and discloses the device itself.

The structure is fabricated by forming a high resistivity epitaxial layer of one conductivity type on a low resistivity substrate of the same conductivity type. A high resistivity epitaxial layer of opposite conductivity type is then formed on the previously formed high resistivity layer. A silicon dioxide layer is formed on the top surface of the wafer and source and gate region windows are opened in the silicon dioxide layer by conventional photolithography and etching. The gate windows are then protected with a thin silicon dioxide layer and the high resistivity layer of opposite conductivity type is etched through the open source windows. The resulting etched source groove is then prediffused with source impurities and diffused to form a channel of one conductivity type extending from the source groove through to the high resistivity layer of one conductivity type. The gate windows are reopened and source and gate electrodes are formed using standard metal deposition and patterning.

The static induction transistor realized by the method of the present invention has improved performance due to the particular shape of very short active channel region in the source-drain path. The process is simple, does not require submicron mask registration, has only one critical mask (metal deposition) and has only one diffusion step.

The elements of the Figures are not drawn to scale and the Figures are intended only for use in explanation of the fabrication steps and the resulting structure.

DETAILED DESCRIPTION OF THE INVENTION

A wafer, or substrate, of single crystal semiconductor material of one conductivity type is provided as the supporting structure for fabrication of a field effect semiconductor device or static induction transistor according to the present invention. The substrate may be, by way of example, silicon of n-type conductivity.

Figure 1:
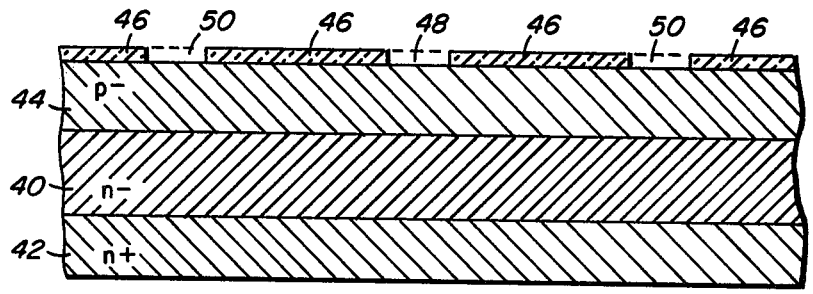
FIG. 1 is a cross-sectional view of a segment of previously processed semiconductor crystal after formation of high resistivity epitaxial layers and a windowed silicon dioxide layer.

FIG. 1 illustrates a fragment of semiconductor wafer during processing of a static induction transistor according to a preferred embodiment of the present invention. A first thin, high resistivity epitaxial layer 40 of n-type conductivity is grown on the upper surface of a highly doped substrate 42 of the same conductivity type. A second thin, high resistivity epitaxial layer 44 of opposite or p-type conductivity is grown on the upper surface of n-type epitaxial layer 40. Layers 40 and 44 may each be, for example, 4 microns in thickness. Subsequently, a silicon dioxide layer 46 is formed on the top surface of p-type epitaxial layer 44. Parallel source windows 48 and gate windows 50 of approximately one and one-half microns in width are opened in silicon dioxide layer 46 by conventional photolithography and etching. The spacing between the edges of gate windows 50 and the edges of adjacent source window 48 is approximately three microns.

For the purpose of this application high resistivity silicon means at least 10 ohm-cm and low resistivity silicon means no more than 0.01 ohm-cm.

Figure 2:
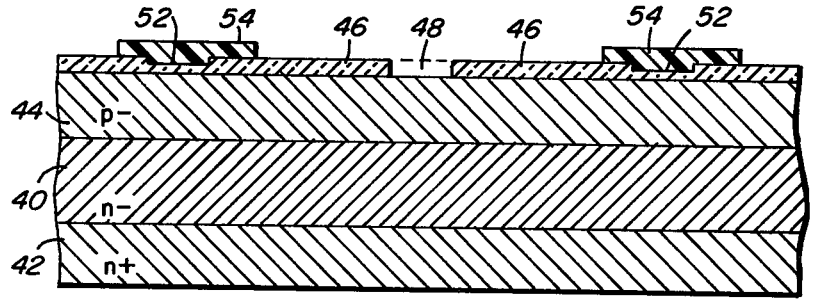
FIG. 2 illustrates protection of gate windows.

As illustrated in FIG. 2, a thin silicon dioxide layer 52 is grown in gate windows 50 as well as in source window 48. Silicon dioxide layer 52 may be, for example, 100 nanometers thick. As also illustrated in FIG. 2, the thin silicon dioxide layer grown in source window 48 is removed by etching after masking layer 54 is added using a photoresist step having relaxed alignment requirements.

Figure 3:
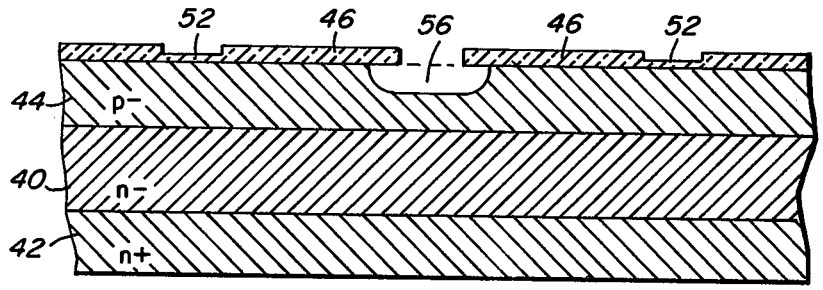
FIG. 3 illustrates etching of the source groove.

Masking layer 54 is then removed and, as illustrated in FIG. 3, source groove 56 is etched in p-type epitaxial layer 44 using, for example, a mixture of hydrofluoric acid, nitric acid and acetic acid. Source groove 56 may be, for example, approximately 2.5 microns in depth. The etching process will undercut a part of silicon dioxide layer 46.

Figure 4:
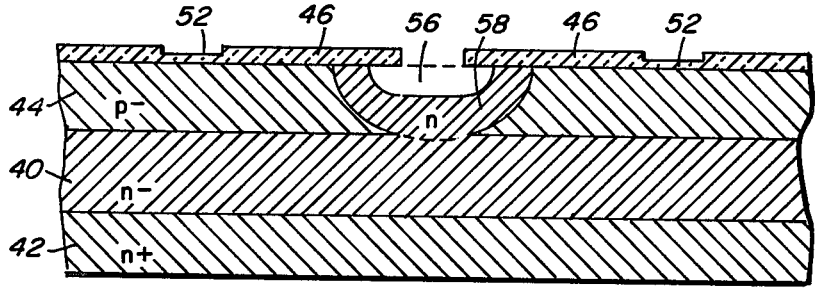
FIG. 4 illustrates diffusion of source impurities and formation of the channel.

As illustrated in FIG. 4, n-type diffusion region 58 is formed in p-type epitaxial layer 44. Diffusion region 58 may be formed by a prediffusion step in which n-type impurities are deposited in groove 56 from, for example, phosphorous oxychloride or solid phosphorous sources followed by a drive-in diffusion step. The depth of groove 56 and the diffusion depth are chosen in such a way that a channel or continuous n-type region will form between the surface of groove 56 and n-type epitaxial layer 40. The junction of diffused region 58 and n-type epitaxial layer 40 comprises the controlled channel of the device.

Figure 5:
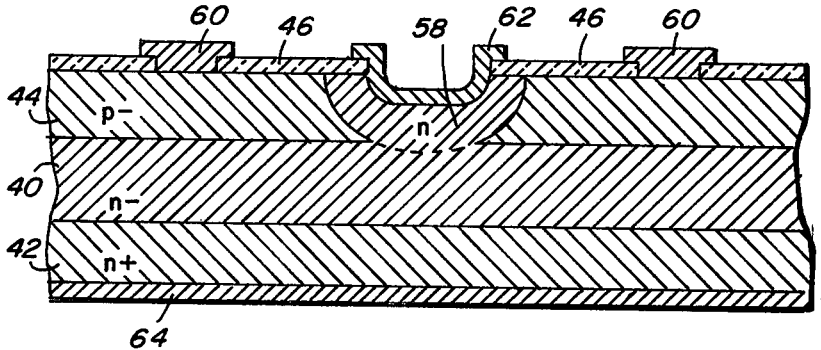
FIG. 5 illustrates etching to open gate windows and to remove source overhang and illustrates depositing of metal source and gate electrodes.

Silicon oxide layers 52 in gate windows 50 are removed by a short etching step. As shown in FIG. 5, metal is deposited using conventional deposition and patterning techniques to form gate electrodes 60 and source electrodes 62. A drain electrode 64 is deposited on the back surface of highly doped substrate 42. After processing the individual devices can be separated by any one of a number of conventional techniques.

In the various figures a cross-section of a static induction transistor is shown. Source regions 58 are formed as strips, for example, 100 to 120 microns in length normal to the plane of the cross-section. These source regions 58, for example, are at least about 10 microns shorter than the gate regions. The length of the regions is primarily limited by the maximum permitted voltage drop along the elctrodes which contact the regions. Additionally, a device with a single source and two gates is shown in FIG. 5. For increased power handling capability additional cells or gate-source combinations can be added as is the normal practice without departing from the scope of the invention.

The static induction transistor realized through the above described processing sequence has a very short active channel length for control of current flow from source to drain resulting in improved voltage gain. The transistor may be constructed using simple processes without use of submicron masking registration. Only one diffusion step is used and the only critical masking step is for defining the metal electrodes.

What is claimed is:

1. A gate-source structure for a static induction transistor comprising:

a high resistivity epitaxial layer of one conductivity type;

a high resistivity epitaxial layer of opposite conductivity type formed on said one-type epitaxial layer;

a silicon dioxide layer formed on said opposite-type epitaxial layer;

parallel source and gate windows in said silicon dioxide layer;

source groove in said opposite-type epitaxial layer at the location of said source windows;

diffused region of said one conductivity type extending from the surface of said grooves through said opposite-type epitaxial layer to form a channel to said one-type epitaxial layer;

gate electrodes deposited on said opposite-type epitaxial layer at said gate window locations; and source electrode deposited on said diffused region at said source groove surface.

* * * * *